Figure 1:
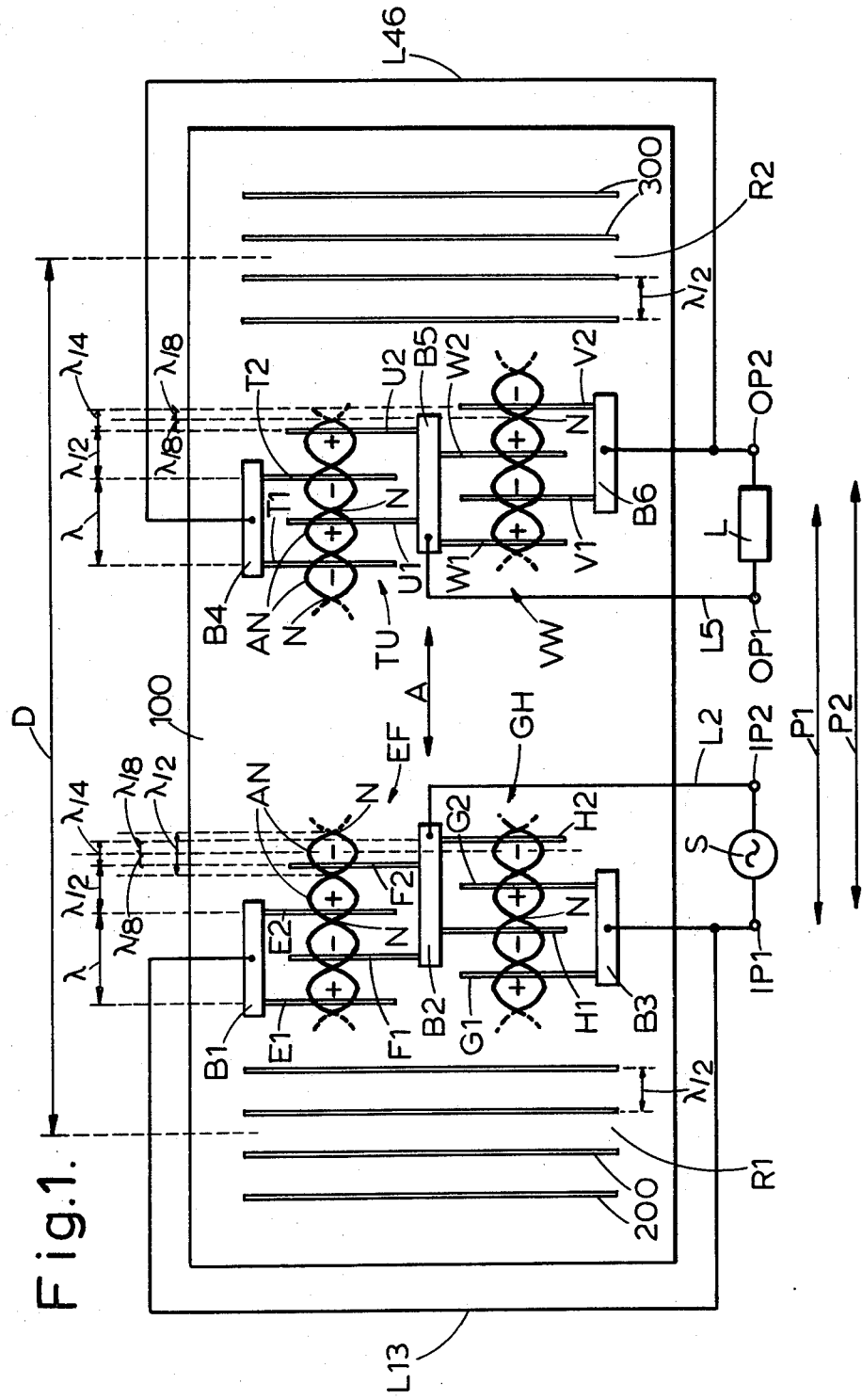

United States Patent [19]

Mitchell

[11] 4,178,571
[45] Dec. 11, 1979

[54] ACOUSTIC SURGAVE WAVE RESONATOR DEVICES

[75] Inventor: Richard F. Mitchell, Merstham, England

[73] Assignee: U.S. Philips Corporation, New York, N.Y.

[21] Appl. No.: 872,615

[22] Filed: Jan. 26, 1978

[30] Foreign Application Priority Data

Feb. 4, 1977 [GB] United Kingdom ............... 4643/77

[51] Int. Cl.² .................. H03H 9/04; H03H 9/26; H03H 9/32; H01L 41/10
[52] U.S. Cl. ................................. 333/194; 333/195; 333/196
[58] Field of Search ......... 333/71, 72, 30 R, 150–154, 333/194–196, 193; 310/313, 366; 358/167, 188, 905; 331/107 A

[56] References Cited

U.S. PATENT DOCUMENTS

| 3,886,504 | 5/1975 | Hartmann et al. | 333/72 |
| 4,065,735 | 12/1977 | Palfreeman et al. | 333/72 |
| 4,081,769 | 3/1978 | Shreve | 333/72 |

Primary Examiner—Alfred E. Smith
Assistant Examiner—Marvin Nussbaum
Attorney, Agent, or Firm—Thomas A. Briody; Bernard Franzblau

[57] ABSTRACT

The input and output transducers associated with an acoustic surface wave resonator, or with respective acoustically coupled cavities, are split into staggered pairs. Furthermore they are located with respect to the standing wave pattern(s) and connected to input and output terminals in such manner as to suppress the response of the output transducer to travelling waves received directly from the input transducer and reduce the stopband level of the device associated with that response.

12 Claims, 3 Drawing Figures

ACOUSTIC SURGAVE WAVE RESONATOR DEVICES

The invention relates to an acoustic surface wave resonator employing an acoustic surface standing wave pattern produced in one or more resonant cavities.

Various types of such resonators are known from U.S. Pat. No. 3,886,504. A first type known from this Patent comprises an acoustic surface wave resonator comprising a substrate having a piezoelectric surface, a pair of input terminals, input transducing means disposed on the surface and connected to said input terminals for converting an electrical input signal into travelling acoustic surface waves with a predetermined direction of propagation, a pair of reflectors on said surface which are disposed on both sides of the input transducing means in the direction of propagation so as to define a resonant cavity which is capable of supporting an acoustic surface standing wave resonance pattern, a pair of output terminals, and output transducing means connected to said output terminals and disposed on said surface inside the resonant cavity for converting acoustic surface wave energy into an electrical output signal.

A second type of resonator known from said Patent comprises an acoustic surface wave resonator comprising a substrate having a piezoelectric surface, a pair of input terminals, input transducing means disposed on said surface and connected to said input terminals for converting an electrical input signal into travelling acoustic surface waves with a predetermined direction of propagation, at least three reflectors on said surface which are disposed in alignment opposite each other in the direction of propagation, a first adjacent pair of said reflectors being disposed on both sides of the input transducing means so as to define a first resonant cavity which is capable of supporting a standing acoustic surface wave resonance pattern, and a second adjacent pair of reflectors disposed so as to define a second resonant cavity, each reflector involved in defining more than one resonant cavity having a reflectivity which allows acoustic surface wave energy to be coupled between said resonant cavities, a pair of output terminals, output transducing means connected to said output terminals and disposed on said surface inside the second resonant cavity for converting acoustic surface wave energy into an electrical output signal.

In these two known types of acoustic surface-wave resonators the input transducing means and the output transducing means are each constituted by two sets of electrodes forming a single interdigital transducer, and each interdigital transducer is located so that its areas of maximum sensitivity coincide with maxima in the standing wave pattern. In both cases the electrical energy supplied by the output transducer responsive to the resonance pattern at the resonant mode frequency has a very narrow frequency passband. However the output transducer is also responsive to travelling waves from the input transducer in a second wider passband which includes the very narrow resonant mode frequency passband. The amplitude of electrical energy supplied by the output transducer and responsive to travelling waves in this second wider passband results in an undesirably small difference in level between the stopband level and the level of said very narrow frequency passband at the resonant mode frequency.

An object of this invention is to provide an acoustic surface-wave resonator with a lower stopband level.

According to the invention an acoustic surface wave resonator of the afore-mentioned first or second type is characterized in that each of said transducing means comprises a first and a second interdigital transducer which are displaced relative to each other both normal to and parallel to said direction of propagation and which each comprise two sets of electrodes, the electrodes of each set being electrically connected in common, that each of said input terminals and each of said output terminals is connected to a different pair of electrode sets, one set forming part of the first and the other set forming part of the second interdigital transducer of the relevant transducing means, that the two sets of electrodes which are jointly connected to a terminal are selected so that they are coupled to the same phase of the acoustic surface wave resonance pattern which co-operates with the relevant transducing means, whereas both the two input terminals and the two output terminals are coupled to mutually opposite phases of said resonance pattern via the sets of electrodes, and that the first interdigital transducers of the two transducing means are spaced apart by a first distance in the direction of propagation and the second interdigital transducers of said two transducing means are spaced apart by a second distance and the two sets of electrodes, which are connected to each of said terminals, are selected in cooperation with said first and second distances in such a way that for each output terminal the two sets of electrodes connected thereto respond to travelling acoustic surface waves launched by the input transducing means with opposite potentials.

The invention is based on the realisation that by splitting both the input and output transducers into staggered pairs of interdigital transducers and by locating both pairs of transducers so that they couple with less than maximum efficiency to the resonance pattern, or patterns as the case may be, it is possible to select the disposition of the input pair of transducers with respect to the resonance pattern and the connection of the sets of electrodes of that pair of transducers to the input terminals differently from the disposition of the output pair of transducers with respect to the same resonance pattern, or its own resonance pattern as the case may be, and the connection of the sets of electrodes of that pair of transducers to the output terminals such that the responses of the pair of output transducers to the resonance pattern are added at the output terminals whereas the responses of the pair of output transducers to travelling waves directly received from the input transducers are subtracted from each other at the output terminals.

An acoustic surface wave device of the first known type, that is to say having input and output transducing means in the same resonant cavity, can be considered as a filter. When constructed according to the invention, the stopband level is improved. Two devices of this type can be coupled together by connecting the output terminals of the first device to the input terminals of the second device to form, or to form part of, a coupled resonator filter. In this case, the travelling waves from the input transducing means of the first device will not reach the output transducing means of the second device so that the cascading of the two devices will of itself reduce the stopband level. However, the reduction of the stopband level within each resonator is still advantageous for further reduction of the overall stopband level.

An acoustic surface wave device of the second known type, that is to say having input and output transducing means in different resonant cavities with leakage of acoustic energy between these two cavities, is a coupled resonator filter. In this case the travelling waves from the input transducing means in the first resonant cavity will reach the output transducing means in the second cavity, and so the reduction of the stopband level of the device when constructed according to the invention will be particularly large.

In an acoustic surface wave resonator filter in which two resonant cavities are coupled by an electrical connection between the output transducing means in one cavity and the input transducing means in the other cavity, the strength of coupling between the cavities is inherently small and the passband of the filter thus tends to be narrow. In an acoustic surface wave resonator filter in which two resonant cavities, one having an input transducing means therein and the other having an output transducing means therein, are coupled by leakage of acoustic energy through one or more shared reflectors, the strength of coupling between the cavities can be large and the passband of the filter thus can be wide. Such narrow passband or wide passband filters may each be suitable for particular applications. In both cases the passband of the filter is generally much narrower than the passbands of the transducing means and in all these cases the invention provides a reduction of the stopband level outside the passband of the filter.

In order to produce the most uniform resonance pattern in the resonant cavity the electrode patterns of the four sets of electrodes of the input transducing means and their disposition with respect to said resonance pattern is preferably such that these four sets of electrodes couple with equal strength to the resonance pattern.

For the same reason the first and second interdigital transducers of the input transducing means are preferably substantially similar and are furthermore disposed to couple with equal strength to the resonance pattern.

In order to ensure that the energy supplied by the output transducing means at the output terminals at the resonant mode frequency is as high as possible the electrode patterns of the four sets of electrodes of the output transducing means and their disposition with respect to the resonance pattern is preferably such that these four sets of electrodes couple with equal strength to the resonance pattern. Preferably, the first and second interdigital transducers of the output transducing means have a substantially equal amplitude-frequency response, which serves to enhance the suppression of the amplitude of the electrical signal at the output terminals in said second pass-band responsive to the travelling waves.

Furthermore, the spacings between the first and second interdigital transducers are preferably equal, which ensures that the electrical signal obtained at the output terminals responsive to travelling waves is suppressed over a maximum bandwidth.

A number of desirable features in respect of the operation of the resonator are effectively combined in a preferred embodiment which is characterized in that the first and second interdigital transducers of each transducing means are substantially similar, consecutive electrodes of a set of electrodes of the first interdigital transducer form pairs of electrodes with consecutive electrodes of a set of electrodes of the second interdigital transducer, and the electrodes of each pair are displaced from the nearest antinode of the resonance pattern by a substantially equal distance in opposite directions, while the electrodes of each pair of one of the said transducing means are connected to the same terminal and the antinodes of the resonance pattern which are nearest the relevant electrodes are of the same phase, whereas the electrodes of each pair of the other transducing means are connected to different terminals of this transducing means and the antinodes of the resonance pattern which are nearest the relevant electrodes are of opposite phase.

A further preferred embodiment, which effectively provides said desirable features, is characterized in that the four interdigital transducers of the two transducing means are substantially similar and the first and second interdigital transducers of each transducing means are displaced from each other by a quarter wavelength of the resonance pattern in the direction of propagation and that the electrodes of each set of electrodes have an effective spacing from each other which is equal to one wavelength of said resonance pattern, while the first interdigital transducers and the second interdigital transducers are spaced apart by the same distances, and the two electrodes of said pairs of the first and second interdigital transducers are displaced from the nearest antinode of the resonance pattern by an eighth of a wavelength of said resonance pattern.

If desired each electrode may be split into two sub-electrodes which are staggered relative to each other in the direction of propagation.

Figure 2:
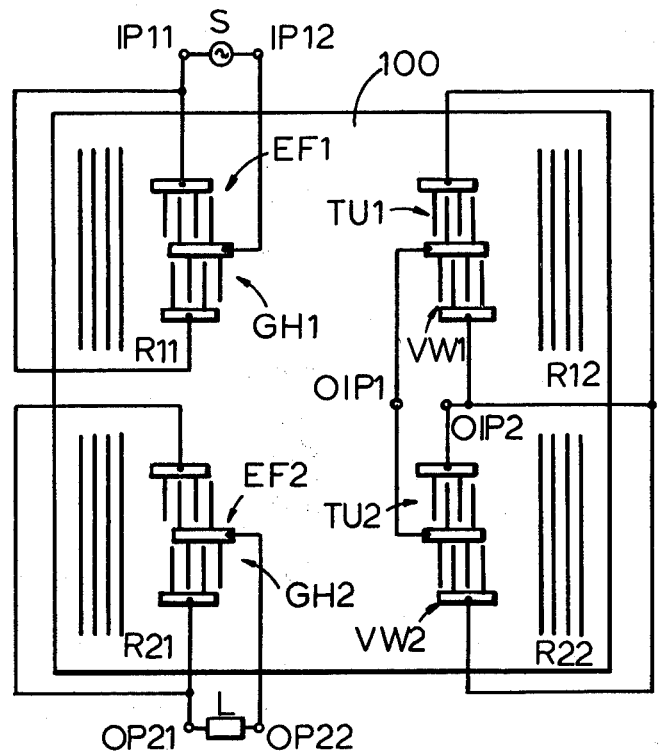
Figure 3:
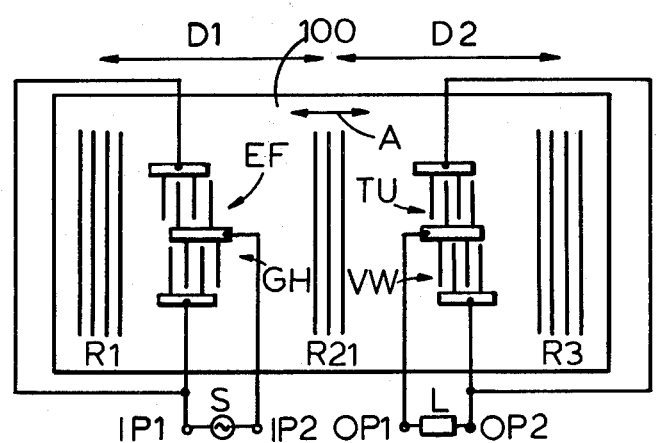

The invention will now be described in more detail with reference to the accompanying drawings, in which:

FIG. 1 is a schematic plan view of an acoustic surface wave device according to the invention having input and output transducing means in a single resonant cavity, FIG. 2 is a schematic plan view of two devices as shown in FIG. 1 coupled together to form a coupled resonator filter according to the invention, and FIG. 3 is a schematic plan view of an acoustic surface wave device according to the invention having input and output transducing means in different resonant cavities with leakage of acoustic energy between the two cavities to form a coupled resonator filter.

Referring now to FIG. 1, there is shown a substrate having a piezoelectric surface 100 of material capable of propagating and supporting acoustic surface waves, e.g. Y cut Z propagating lithium niobate.

A source of input electrical energy S is connected to a pair of input terminals IP1 and IP2. Input transducing means consisting of first and second interdigital transducers EF and GH is disposed on the surface 100 and connected to the input terminals IP1 and IP2 for converting input electrical energy applied thereto into travelling acoustic surface waves propagating on the surface 100 parallel to a predetermined axis A. The first interdigital transducer EF is formed by a set of electrodes E1 and E2 connected in common to a bus bar B1 and a set of electrodes F1 and F2 connected in common to a bus bar B2. The second interdigital transducer GH is formed by a set of electrodes G1 and G2 connected in common to a bus bar B3 and a set of electrodes H1 and H2 connected in common to the bus bar B2. The electrodes of each of the four sets which make up the input transducing means, for example the electrodes E1 and E2, have an effective spacing in the direction of the axis A of one wavelength $\lambda$ of acoustic surface waves at a predetermined frequency f. Adjacent electrodes within each of the first and second interdigital transducers, for example the electrodes E2 and F2 have an effective spacing in the direction of the axis A of half a wavelength $\lambda/2$ at said frequency f. The first and second interdigital transducers EF and GH are displaced normal to the axis A and are displaced in the direction of the axis A by a quarter wavelength $\lambda/4$ at said frequency f, as can be seen from the $\lambda/4$ displacement of the electrodes F2 and H2. The input transducing means has an amplitude-frequency response equal to that of each of the similar first and second interdigital transducers EF and GH, which includes a first frequency passband centered on the frequency f. The width of this first passband depends essentially on the number of electrodes in each of the interdigital transducers EF and GH and in a typical example the passband is 4 MHz centered on a frequency f of 200 MHz.

A pair of reflectors R1 and R2 are disposed on the surface 100 on both sides of the input transducing means for respectively substantially reflecting the travelling waves. Each reflector R1 and R2 is a periodic grating structure comprising a plurality of discrete discontinuities, 200 and 300 respectively, on the piezoelectric surface 100. Each discontinuity, which may be for example a conductive strip on the surface or a groove in the surface, is provided for reflecting a portion of acoustic surface wave energy incident thereon. The reflectors R1 and R2 each have a reflective frequency passband, and in a typical example each of the reflectors R1 and R2 consists of two hundred and fifty discontinuities 200 and 300 having an effective spacing of half a wavelength $\lambda/2$ at said frequency f of 200 MHz providing a reflective passband of 800 kHz centred on said frequency f of 200 MHz. The pair of reflectors R1 and R2 are spaced apart to cooperatively define a resonant cavity capable of supporting an acoustic surface standing wave resonance pattern at a resonant mode frequency within said reflective passbands. For this purpose, the effective length D of the resonant cavity will be chosen to be substantially an integral number of half wavelengths of acoustic surface waves at that resonant mode frequency. Owing to the standing wave resonance pattern the electrical potential measured at the surface will exhibit consecutive minima and maxima which are referred to hereinafter as nodes and antinodes.

The resonant mode frequency is the same as the centre frequency f of the input transducing means and so the electrodes of the input transducing means are regularly disposed with respect to the standing wave resonance pattern. Consecutive electrodes of a set of electrodes of the first interdigital transducer EF form a pair of electrodes with a consecutive electrode of the set of electrodes in the second interdigital transducer GH from which it is displaced parallel to the axis A by a quarter wavelength $\lambda/4$. The pairs of electrodes are thus E1 and G1, E2 and G2, F1 and H1, and F2 and H2. The two electrodes of each pair are connected to the same input terminal and are displaced from the same antinode AN of the resonance pattern by an eighth of a wavelength $\lambda/8$ at the resonant mode frequency f in opposite directions parallel to the axis A. The set of electrodes E1 and E2 and the set of electrodes G1 and G2 which are connected together by the line L13 to the input terminal IP1 are coupled to the same phase (shown positive in FIG. 1) of the resonance pattern.

The set of electrodes F1 and F2 and the set of electrodes H1 and H2 which are connected together by the line L2 to the input terminal IP2 are also mutually coupled to the same phase (shown negative in FIG. 1) of the resonance pattern. Thus the two input terminals IP1 and IP2 are coupled via the sets of electrodes of the input transducing means to opposite phases of the resonance pattern for enhancement of the excitation of the resonance pattern.

A load L is connected to a pair of output terminals OP1 and OP2. Output transducing means consisting of first and second similar interdigital transducers TU and VW is disposed on the surface 100 inside the cavity provided by the reflectors R1 and R2. The ouput transducers are connected to the output terminals OP1 and OP2 and are responsive to the acoustic surface travelling waves from the input transducing means and are also responsive to the acoustic surface standing wave resonance pattern thereby converting acoustic energy to an electrical output signal which is applied to the output terminals OP1 and OP2. The first interdigital transducer TU is formed by a set of electrodes T1 and T2 electrically connected in common to a bus bar B4 and a set of electrodes U1 and U2 electrically connected in common to a bus bar B5. The second interdigital transducer is formed by a set of electrodes V1 and V2 electrically connected in common to a bus bar B6 and a set of electrodes W1 and W2 electrically connected in common to the bus bar B5.

The output transducing means is similar to the input transducing means as follows. The interdigital transducers TU and VW each have the same number of electrodes of the same shape and size as the interdigital transducers EF and GH. The electrodes of each of the four sets which make up the output transducing means, for example the electrodes T1 and T2, have an effective spacing equal to one wavelength $\lambda$ at the predetermined frequency f. Adjacent electrodes within each of the first and second interdigital transducers, for example the electrodes T2 and U2, have an effective spacing equal to half a wavelength $\lambda/2$ at said frequency f. The first and second interdigital transducers TU and VW are displaced in the direction of the axis A by a quarter wavelength $\lambda/4$ at said frequency f, as can be seen from the $\lambda/4$ displacement of the electrodes U2 and V2. Furthermore, the displacement of the second interdigital transducer VW from the first interdigital transducer TU of the output transducing means parallel to the axis A is in the same direction as the displacement of the second interdigital transducer GH from the first interdigital transducer EF of the input transducing means parallel to the axis A. The output transducing means has an amplitude-frequency response, equal to that of the first and second interdigital transducers TU and VW, which includes a second frequency passband which is the same as the first frequency passband of the input transducing means and is also centered on the frequency f.

The resonant mode frequency of the cavity is thus also the same as the center frequency f of the output transducing means and so the electrodes of the output transducing means are also regularly disposed with respect to the standing wave resonance pattern. Each electrode of a set of electrodes of the first interdigital transducer TU forms a pair of electrodes with an electrode of the set of electrodes of the second interdigital transducer VW from which it is displaced parallel to the axis A by a quarter wavelength $\lambda/4$. The pairs of electrodes are thus T1 and W1, T2 and W2, U1 and V1, and U2 and V2. The two electrodes of each pair are connected to opposite output terminals and are displaced from the same node N of the resonance pattern by an eighth of a wavelength λ/8 at the resonant mode frequency f in opposite directions parallel to the axis A. Thus the set of electrodes T1 and T2 and the set of electrodes V1 and V2 which are connected together by the line L46 to the output terminal OP2 are coupled to the same phase (shown negative in FIG. 1) of the resonance pattern. The set of electrodes U1 and U2 and the set of electrodes W1 and W2 which are connected by the line L5 to the output terminal OP1 are coupled to the same phase (shown positive in FIG. 1) of the resonance pattern. Thus the two output terminals OP1 and OP2 are coupled via the sets of electrodes of the output transducing means to opposite phases of the resonance pattern for enhancement of the amplitude of the electrical energy applied to the load L via the output terminals OP1 and OP2 at the resonant mode frequency responsive to the resonance pattern.

The first and second interdigital transducers are displaced parallel to the axis A by λ/4 in the same direction in both the input transducing means and the output transducing means. Thus, since all four interdigital transducers are similar, the path length P1 for travelling waves between the first interdigital transducers EF and TU is the same as the path length P2 for travelling waves between the second interdigital transducers GH and VW at all frequencies. At a given instant of time the electrodes E1, E2, G1 and G2 which are connected to the input terminal IP1 simultaneously launch travelling waves of one phase, and at the same instant of time the electrodes F1, F2, H1 and H2 simultaneously launch travelling waves of the opposite phase to said one phase. The electrodes T1, T2, W1 and W2 are simultaneously responsive to travelling waves of said one phase, and at the same time the electrodes U1, U2, V1 and V2 are simultaneously responsive to travelling waves of the opposite phase to said one phase. However the electrodes T1, T2, V1 and V2 are connected to the same output terminal OP2, and also the electrodes W1, W2, U1 and U2 are connected to the same output terminal OP1. Thus for each output terminal OP1 and OP2, the two sets of electrodes connected thereto are responsive to the travelling waves at all frequencies in the passband of the first and second output interdigital transducers TU and VW to produce potentials of opposite phase and so electrical energy applied to the load L via the output terminals OP1 and OP2 responsive to travelling waves is entirely suppressed.

Various possible modifications, within the scope of the invention, to the acoustic surface wave resonator shown in FIG. 1 will now be discussed.

In the device shown in FIG. 1 the electrode patterns of the four sets of electrodes of the input transducing means and their disposition with respect to the resonance pattern is such that each of those sets of electrodes couples with equal strength to the resonance pattern at the resonant mode frequency f, i.e. all the electrodes are midway between a node N and an antinode AN of this resonance pattern. For the input transducing means this ensures that a uniform resonance pattern is produced in the resonant cavity, whereas for the output transducing means the amplitude of the electrical signal obtained at the output terminals OP1 and OP2 at the resonant mode frequency is a maximum. However, this feature is not essential to the invention. For example, the electrodes of the interdigital transducers EF and VW could be nearer to the nodes, while the electrodes of the interdigital transducers GH and TU are nearer to the antinodes of the resonance pattern.

In the device shown in FIG. 1 the first and second interdigital transducers of each of the input transducing means are furthermore substantially similar and are disposed to couple with equal strength to said resonance pattern. For the input transducing means this enhances the uniformity of the resonance pattern, whereas for the output transducing means this enhances the suppression of the response to travelling waves. This will also tend to ensure the exitation of a uniform resonance pattern in the cavity. However, this feature is not essential to the invention. For example, the interdigital transducers of each of the transducing means could have different numbers of electrodes and/or different size electrodes.

Another feature of the device shown in FIG. 1 is that the first and second path lengths P1 and P2 are the same. This will ensure that the electrical energy obtained at the output terminals responsive to the travelling waves is suppressed over the maximum bandwidth. This is achieved by the compact device shown in FIG. 1 in which the first and second interdigital transducers of each transducing means are displaced relative to each other by a quarter wavelength λ/4 at the resonant mode frequency f parallel to the axis A and in which the common bus bars B2 and B5 are provided. The same advantage of suppression of the response to travelling waves over the maximum bandwidth could also be achieved in a less compact device if the path lengths P1 and P2 were changed by different integral numbers of wavelengths at the frequency f. However, the path lengths P1 and P2 could also be made to differ by other than an integral number of wavelengths at the frequency f, in which case there will still be suppression of the response to travelling waves but over a smaller bandwidth. Also in a less compact device the common bus bars B2 and B5 could be each split into separate bus bars so that there is a greater displacement of the first and second interdigital transducers normal to the axis A.

In the device shown in FIG. 1, the discontinuities 200 of the reflector R1 and the discontinuities 300 of the reflector R2 are spaced at half a wavelength at the same frequency f and the reflectors R1 and R2 have the same number of discontinuities. These two factors provide the reflectors R1 and R2 with reflective passbands of the same width centered on the same frequency f. Neither of these factors is essential as long as there is a range of frequencies where these two passbands overlap.

In the device shown in FIG. 1, the resonance pattern is based on a resonance mode frequency f which is equal to the frequency f for which the reflector discontinuities 200 and 300 are spaced at half a wavelength. A resonance pattern will be set up for any frequency within the overlap region of the passbands of the reflectors R1 and R2 for which the effective length D of the cavity is an integral number of half wavelengths. If this overlap region of the passbands and the length D are both sufficiently large then there can be more than one resonant mode frequency and the resonator will have a very narrow frequency passband associated with the high Q factor of the resonator resulting from the high efficiency of the reflectors centered on each of these resonant mode frequencies. Q is defined as $f_o/\Delta f$, $\Delta f$ being the 3 db bandwidth of the resonator at the frequency $f_o$.

In the device shown in FIG. 1 the input and output transducing means both consist of first and second interdigital transducers both of which have adjacent electrodes spaced at half a wavelength $\lambda/2$ at the same frequency f for which the reflector discontinuities 200 and 300 are spaced at half a wavelength. However this feature is not essential. For example, if there is more than one resonant mode frequency in the resonance pattern of the cavity the nodes and antinodes of the resonance pattern will be at different spacings for the different resonant mode frequencies and so at substantially the same locations near the reflectors R1 and R2 but at substantially different locations near the centre of the cavity for the different resonant mode frequencies. If it is desired to couple the input and output transducing means efficiently to a resonant mode frequency other than the frequency f, then the transducing means can be located in suitable positions along the length of the resonant cavity and the adjacent electrodes of the interdigital transducers can be spaced at half a wavelength at this other frequency.

In the device shown in FIG. 1 a source of input electrical energy S is connected to the terminals IP1 and IP2 and a load L is connected to the terminals OP1 and OP2. The device will function in exactly the same manner if the source S is coupled to the terminals OP1 and OP2 and the load L is coupled to the terminals IP1 and IP2.

In the device shown in FIG. 1 the structure for each of the reflectors R1 and R2 is a periodic grating structure comprising a plurality of discrete discontinuities at the piezoelectric surface, each discontinuity being provided for reflecting a portion of acoustic surface wave energy incident thereon. It is envisaged that other structures could provide reflectors which reflect travelling acoustic surface waves with sufficient efficiency to enable a resonant cavity to be provided.

In the device shown in FIG. 1 each electrode may be split into two electrode parts displaced equal distances in opposite directions parallel to the axis A.

FIG. 2 shows a coupled resonator consisting of two devices in accordance with FIG. 1. The pair of reflectors R11 and R12, and also the pair of reflectors R21 and R22, are provided and arranged in the same manner as the pair of reflectors R1 and R2 shown in FIG. 1. The configuration and arrangement of the interdigital transducers EF1, GH1, TU1 and VW1, and also the configuration and arrangement of the interdigital transducers EF2, GH2, TU2 and VW2, are the same in their respective resonant cavities as that of the interdigital transducers EF, GH, TU and VW in its respective resonant cavity in FIG. 1. Within the resonant cavity formed by the reflectors R11 and R12, the interdigital transducers EF1 and GH1 form input transducing means which are connected to a source of electrical energy S via terminals IP11 and IP12 and the interdigital transducers TU1 and VW1 form output transducing means which are connected to terminals OIP1 and OIP2. Within the cavity formed by the reflectors R21 and R22, the interdigital transducers TU2 and VW2 form input transducing means which are connected to the terminals OIP1 and OIP2 and the interdigital transducers EF2 and GH2 form output transducing means which are connected to a load L via terminals OP21 and OP22.

An acoustic surface wave device of the type shown in FIG. 1, that is to say having input and output transducing means in the same resonant cavity, can be considered as a filter in which the stopband level is improved. Two such devices coupled together as shown in FIG. 2 by connecting the output terminals of the first device to the input terminals of the second device form, or may form part of, a coupled resonator filter. In this case, the travelling waves from the input transducing means EF1, GH1 of the first device will not reach the output transducing means EF2, GH2 of the second device and the cascading of the two devices will of itself reduce the stopband level. However, the reduction of the stopband level within each resonator is still advantageous for further reduction of the overall stopband level.

Referring now to FIG. 3, an acoustic surface wave device includes three reflectors R1, R21 and R3 disposed in alignment on a piezoelectric surface 100 parallel to an axis A for respectively substantially reflecting travelling waves. A first adjacent pair R1 and R21 of these reflectors are spaced apart by an effective length D1 to define a first resonant cavity capable of supporting an acoustic surface standing wave resonance pattern at a resonant mode frequency within the reflective passbands of the reflectors R1 and R21. A second adjacent pair R21 and R3 of these reflectors are spaced apart by an effective length D2 to define a second resonant cavity capable of supporting an acoustic surface standing wave resonance pattern at a resonant mode frequency within the reflective passbands of the reflectors R21 and R3. The configuration and arrangement of the pair of reflectors R1 and R21, and also the configuration and arrangement of the pair of reflectors R21 and R3, is the same as the configuration and arrangement of the pair of reflectors R1 and R2 of the device shown in FIG. 1 with the necessary feature that the reflector R21 which has an adjacent reflector on each side thereof is formed with a reflectivity, for example a reduced reflectivity by having fewer discontinuities, for allowing the passage of travelling wave energy therethrough to couple acoustic energy between the first and second resonant cavities for exciting the resonance pattern in the second cavity. The configuration and arrangement of the interdigital transducers EF and GH in the first cavity formed by the reflectors R1 and R21 is the same as the configuration and arrangement of the interdigital transducers EF and GH in the single cavity of the device shown in FIG. 1, and these transducers are connected via terminals IP1 and IP2 to an electrical input energy source S. The configuration and arrangement of the interdigital transducers TU and VW in the second cavity formed by the reflectors R21 and R3 is the same as the configuration and arrangement of the interdigital transducers TU and VW in the single cavity of the device shown in FIG. 1, and these transducers are connected via terminals OP1 and OP2 to a load L.

A possible modification of the device shown in FIG. 3, within the scope of the invention, is to have more than three reflectors in alignment thus forming one or more intermediate resonant cavities between the first resonant cavity containing the input transducing means and the second resonant cavity containing the output transducing means. Such intermediate resonant cavities can be used to adjust the overall response of the device. These resonant cavities may then contain transducing means for coupling to the resonance patterns in those intermediate cavities.

An acoustic surface wave device of the type shown in FIG. 3, that is to say having input and output transducing means in different resonant cavities with leakage of acoustic energy between these two cavities, is a coupled resonator filter. In this case the travelling waves from the input transducing means EF, GH in the first resonant cavity will reach the output transducing means TU, VW in the second resonant cavity, and so the reduction of the stopband level of the device will be particularly large owing to the steps in accordance with the invention.

In an acoustic surface wave resonator filter as shown in FIG. 2 in which two resonant cavities are coupled by an electrical connection between the output transducing means in one cavity and the input transducing means in the other cavity, the strength of coupling between the cavities is inherently small and the passband of the filter thus tends to be narrow. In an acoustic surface wave resonator filter as shown in FIG. 3 in which two resonant cavities, one having an input transducing means therein and the other having an output transducing means therein, are coupled by leakage of acoustic energy through one or more shared reflectors, the strength of coupling between the cavities can be large and the passband of the filter thus can be wide. Such narrow passband or wide passband filters may each be suitable for particular applications. In both cases the passband of the filter is generally much narrower than the passbands of the transducing means so that in all these cases the steps in accordance with the invention provide a reduction of the stopband level outside the passband of the filter.

What is claimed is:

1. An acoustic surface wave resonator comprising
   a substrate having a piezoelectric surface,
   a pair of input terminals,
   input transducing means disposed on the surface and connected to said input terminals for converting an electrical input signal into travelling acoustic surface waves with a predetermined direction of propagation,
   a pair of reflectors on said surface which are disposed on both sides of the input transducing means in the direction of propagation so as to define a resonant cavity which is capable of supporting an acoustic surface standing wave resonance pattern,
   a pair of output terminals, and
   output transducing means connected to said output terminals and disposed on said surface inside the resonant cavity for converting acoustic surface wave energy into an electrical output signal, and wherein:
   each of said transducing means comprise a first and a second interdigital transducer which are displaced relative to each other both normal to and parallel to said direction of propagation and with each transducer comprising two sets of electrodes, the electrodes of each set being electrically connected in common,
   each of said input terminals and each of said output terminals is connected to a different pair of electrode sets, one set forming part of the first and the other set forming part of the second interdigital transducer of the relevant transducing means,
   the two sets of electrodes which are jointly connected to a terminal are selected so that they are coupled to the same phase of the acoustic surface wave resonance pattern which co-operates with the relevant transducing means, whereas both the two input terminals and the two output terminals are coupled to mutually opposite phases of said resonance pattern via the sets of electrodes, and
   the first interdigital transducers of the two transducing means are spaced apart by a first distance in the direction of propagation and the second interdigital transducers of said two transducing means are spaced apart by a second distance and the two sets of electrodes, which are connected to each of said terminals, are selected in cooperation with said first and second distances in such a way that for each output terminal the two sets of electrodes connected thereto respond to travelling acoustic surface waves launched by the input transducing means with opposite potentials.

2. An acoustic surface wave resonator comprising:
   a substrate having a piezoelectric surface,
   a pair of input terminals,
   input transducing means disposed on said surface and connected to said input terminals for converting an electrical input signal into travelling acoustic surface waves with a predetermined direction of propagation,
   at least three reflectors on said surface which are disposed in alignment opposite each other in the direction of propagation, a first adjacent pair of said reflectors being disposed on both sides of the input transducing means so as to define a first resonant cavity which is capable of supporting a standing acoustic surface wave resonance pattern, and a second adjacent pair of reflectors being spaced apart and disposed so as to define a second resonant cavity, each reflector defining more than one resonant cavity having a reflectivity such that acoustic surface wave energy is coupled between said resonant cavities,
   a pair of output terminals,
   output transducing means connected to said output terminals and disposed on said surface inside the second resonant cavity for converting acoustic surface wave energy into an electrical output signal,
   and wherein:
   each of said transducing means comprises a first and a second interdigital transducer which are displaced relative to each other both normal to and parallel to said direction of propagation and with each transducer comprising two sets of electrodes, the electrodes of each set being electrically connected in common,
   each of said input terminals and each of said output terminals is connected to a different pair of electrode sets, one set forming part of the first and the other set forming part of the second interdigital transducer of the relevant transducing means,
   the two sets of electrodes which are jointly connected to a terminal are selected so that they are coupled to the same phase of the acoustic surface wave resonance pattern which co-operates with the relevent transducing means, whereas both the two input terminals and the two output terminals are coupled to mutually opposite phases of said resonance pattern via the sets of electrodes, and
   the first interdigital transducers of the two transducing means are spaced apart by a first distance in the direction of propagation and the second interdigital transducers of said two transducing means are spaced apart by a second distance and the two sets of electrodes, which are connected to each of said terminals, are selected in cooperation with said first and second distances in such a way that for each output terminal the two sets of electrodes connected thereto respond to travelling acoustic surface waves launched by the input transducing means with opposite potentials.

3. An acoustic surface wave resonator as claimed in claim 1 or 2, wherein the electrode patterns of the four sets of electrodes of the input transducing means and their disposition with respect to said resonance pattern is such that said four sets of electrodes couple with equal strength to the resonance pattern.

4. An acoustic surface wave resonator as claimed in claims 1 or 2 wherein the first and second interdigital transducers of the input transducing means are substantially similar and are further disposed to couple with equal strength to the resonance pattern.

5. An acoustic surface wave resonator as claimed in claims 1 or 2 wherein the electrode patterns of the four sets of electrodes of the output transducing means and their disposition with respect to the resonance pattern is such that said four sets of electrodes couple with equal strength to the resonance pattern.

6. An acoustic surface wave resonator as claimed in claims 1 or 2 wherein the first and second interdigital transducers of the output transducing means have a substantially equal amplitude-frequency response.

7. An acoustic surface wave resonator as claimed in claims 1 or 2 wherein the first and the second distance between the first and the second interdigital transducers respectively are equal.

8. An acoustic surface wave resonator as claimed in claim 1 or 2, wherein the first and second interdigital transducers of each transducing means are substantially similar, consecutive electrodes of a set of electrodes of the first interdigital transducer form pairs of electrodes with consecutive electrodes of a set of electrodes of the second interdigital transducer, and the electrodes of each pair are displaced from the nearest antinode of the resonance pattern by a substantially equal distance in opposite directions, while the electrodes of each pair of one of the said transducing means are connected to the same terminal and the antinodes of the resonance pattern which are nearest the relevant electrodes are of the same phase, whereas the electrodes of each pair of the other transducing means are connected to different terminals of said other transducing means and the antinodes of the resonance pattern which are nearest the relevant electrodes are of opposite phase.

9. An acoustic surface wave resonator as claimed in claim 8, wherein the four interdigital transducers of the two transducing means are substantially similar and the first and second interdigital transducers of each transducing means are displaced from each other by a quarter wavelength of the resonance pattern in the direction of propagation and that the electrodes of each set of electrodes have an effective spacing from each other which is equal to one wavelength of said resonance pattern, the first interdigital transducers and the second interdigital transducers being spaced apart by the same distances, and the two electrodes of said pairs of electrodes of the first and second interdigital transducers are displaced from the nearest antinode of the resonance pattern by an eighth of a wavelength of said resonance pattern.

10. An acoustic surface wave resonator as claimed in claims 1 or 2 wherein the first and second interdigital transducers of each transducing means are substantially similar and are displaced from one another in said direction of propagation by a quarter-wavelength of the resonant mode frequency of said resonant cavity, the electrodes of each set of electrodes being effectively spaced apart by a distance equal to one wavelength of said resonant mode frequency, and wherein the respective first interdigital transducers of the input and output transducing means are spaced apart by the same distance as are the respective second interdigital transducers of the input and output transducing means.

11. An acoustic surface wave resonator as claimed in claim 10 wherein for each transducing means consecutive electrodes of a set of electrodes of the first interdigital transducer form pairs of electrodes with consecutive electrodes of a set of electrodes of the second interdigital transducer with the two electrodes of each of said pairs of electrodes being displaced from the nearest antinode of the resonance pattern by an eighth of a wavelength of said resonant mode frequency.

12. An acoustic surface wave resonator as claimed in claims 1 or 2 wherein the first and second interdigital transducers of each transducing means are substantially similar and are displaced from one another in said direction of propagation by a quarter-wavelength of the resonant mode frequency of said resonant cavity, the consecutive electrodes of one set of electrodes of at least one interdigital transducer being spaced apart from respective consecutive electrodes of the second set of electrodes of said one interdigital transducer in said direction of propagation by a distance equal to one-half wavelength of the resonant mode frequency, and wherein the respective first interdigital transducers of the input and output transducing means are spaced apart by the same distance as are the respective second interdigital transducers of the input and output transducing means.

* * * * *